US012392960B2

(12) United States Patent
Pérez López et al.

(10) Patent No.: US 12,392,960 B2
(45) Date of Patent: Aug. 19, 2025

(54) PROGRAMMABLE PHOTONIC INTEGRATED CIRCUIT AND RELATED METHOD OF OPERATION

(71) Applicant: UNIVERSITAT POLITÈCNICA DE VALÈNCIA, Valencia (ES)

(72) Inventors: Daniel Pérez López, Valencia (ES); José Capmany Francoy, Valencia (ES); Prometheus Dasmahapatra, Valencia (ES)

(73) Assignee: UNIVERSITAT POLITÈCNICA DE VALÈNCIA, Valencia (ES)

(*) Notice: Subject to any disclaimer, the term of this patent is extended or adjusted under 35 U.S.C. 154(b) by 335 days.

(21) Appl. No.: 18/016,136

(22) PCT Filed: Jul. 12, 2021

(86) PCT No.: PCT/ES2021/070508
§ 371 (c)(1),
(2) Date: Jan. 13, 2023

(87) PCT Pub. No.: WO2022/013466
PCT Pub. Date: Jan. 20, 2022

(65) Prior Publication Data
US 2023/0251423 A1 Aug. 10, 2023

(30) Foreign Application Priority Data
Jul. 16, 2020 (ES) ................................ ES202030736

(51) Int. Cl.
G02B 6/12 (2006.01)
H03K 19/17728 (2020.01)
H03K 19/17736 (2020.01)

(52) U.S. Cl.
CPC ..... *G02B 6/12033* (2013.01); *H03K 19/17728* (2013.01); *H03K 19/17736* (2013.01); *G02B 2006/12145* (2013.01)

(58) Field of Classification Search
None
See application file for complete search history.

(56) References Cited

U.S. PATENT DOCUMENTS 8,018,244 B2 * 9/2011 Berkley ................. G06N 10/20
326/1
8,798,472 B2 8/2014 Xu
(Continued)

FOREIGN PATENT DOCUMENTS

ES 2752086 B2 8/2020

OTHER PUBLICATIONS

Daniel Perez, "Toward Programmable Microwave Photonics Processors", Journal, 2018, 519-532, vol. 36, No. 2, Journal of Lightwave Technology.
(Continued)

Primary Examiner — Jerry Rahll
(74) Attorney, Agent, or Firm — Hayes Soloway P.C.

(57) ABSTRACT

The present invention relates to a programmable multicore photonic integrated circuit comprising at least one programmable photonic modules or cores, and/or other photonic units like specific high performance blocks, capable of implementing multipurpose signal processing, by the appropriate programming of its resources, routing within the circuits and the blocks to achieve multifunctional operation and the selection of its input and output ports. The invention also relates to a scalable programmable photonic integrated circuits arranged in a modular multicore approach to increase the processing power of the overall system and/or adding a multitude of functionalities enabled by complex
(Continued)

photonics circuitry and parallelization as well as the related operation methods.

17 Claims, 8 Drawing Sheets

(56) References Cited

U.S. PATENT DOCUMENTS

| | | | | |
|---|---|---|---|---|
| 9,354,039 | B2* | 5/2016 | Mower | B82Y 20/00 |
| 9,791,258 | B2* | 10/2017 | Mower | G06N 10/40 |
| 10,268,232 | B2* | 4/2019 | Harris | G06E 3/008 |
| 10,359,272 | B2* | 7/2019 | Mower | G01B 9/02049 |
| 10,619,993 | B2* | 4/2020 | Mower | G06N 20/00 |
| 10,634,851 | B2* | 4/2020 | Steinbrecher | G02B 6/3542 |
| 11,017,309 | B2* | 5/2021 | Roques-Carmes | G06N 3/045 |
| 11,281,972 | B2* | 3/2022 | Shen | G06N 3/0475 |
| 11,507,818 | B2* | 11/2022 | Hosseinzadeh | G06N 3/045 |
| 11,823,012 | B2* | 11/2023 | Gimeno-Segovia | G06N 10/70 |
| 2015/0354938 | A1* | 12/2015 | Mower | G06N 10/60 356/450 |
| 2016/0245639 | A1* | 8/2016 | Mower | G01B 9/02049 |
| 2017/0351293 | A1* | 12/2017 | Carolan | G06N 3/0675 |
| 2018/0274900 | A1* | 9/2018 | Mower | G01B 9/02083 |
| 2019/0310070 | A1* | 10/2019 | Mower | G01B 9/02083 |
| 2020/0200987 | A1* | 6/2020 | Kim | G02B 6/4212 |
| 2020/0209473 | A1 | 7/2020 | Capmany Francoy et al. | |
| 2021/0396932 | A1* | 12/2021 | Perez Lopez | G02B 6/125 |

OTHER PUBLICATIONS

Wim Bogaerts, "Programmable Photonics: an opportunity for an accessible large-volume PIC ecosystem", Journal, 2020, 1-17, vol. 26, No. 5, IEEE Journal of Selected Topics in Quantum Electronics.
Kyle Shiflett, "PIXEL: Photonic Neural Network Accelerator", Article, 2020, 1-14, 2020 IEEE International Symposium on High Performance Computer Architecture (HPCA).
S.J. Ben Yoo, "Heterogeneous 2D/3D Photonic Integrated Microsystems", Journal, 2016, 1-9, vol. 2, Microsystems & Nanoengineering.

* cited by examiner

PROGRAMMABLE PHOTONIC INTEGRATED CIRCUIT AND RELATED METHOD OF OPERATION

CROSS-REFERENCE TO RELATED APPLICATIONS AND PRIORITY

This patent application claims priority from PCT Application No. PCT/ES2021/070508 filed Jul. 12, 2021, which claims priority from Spanish Patent Application No. P202030736 filed Jul. 16, 2020. Each of these patent applications are herein incorporated by reference in their entirety.

OBJECT OF THE INVENTION

The present invention relates to a programmable multi-core photonic integrated circuit comprising at least one programmable photonic modules or cores, and/or other photonic units like specific high performance blocks, capable of implementing multipurpose signal processing, by the appropriate programming of its resources, routing within the circuits and the blocks to achieve multifunctional operation and the selection of its input and output ports. The invention also relates to a scalable programmable photonic integrated circuits arranged in a modular multicore approach to increase the processing power of the overall system and/or adding a multitude of functionalities enabled by complex photonics circuitry and parallelization as well as the related operation methods.

BACKGROUND OF THE INVENTION

Programmable multifunctional photonics (PMP) seeks to design common, multipurpose configurations of integrated optical hardware that can implement a wide variety of functionalities by means of suitable programming a large set of reconfigurable basic processing elements or units. Various authors have covered theoretical works proposing different configurations and design principles for programmable circuits based on cascade beam splitters or Mach-Zehnder interferometers (MZIs). These proposals offer versatile hardware solutions to implement programmable circuits, but none of them address the scalability challenges that limit their evolution and practical use.

The performance of programmable multifunctional photonics and its capability to accomplish complex operations is proportional to the number of tuneable units and basic processing elements that can be integrated. These architectures are plagued by the similar limitations that integrated electronics faced in connection to the number of transistors per chip.

In the case of programmable multipurpose integrated photonic circuits, the experimental demonstrations reported so far are mainly proof of concepts with small-scale integration of tuneable elements. The scalability limits arise from: the maximum number of basic units, which are in turn limited by the footprint and the reticle size of the lithography process employed, the accumulated losses inside the circuit and the optical interfaces, the capability to interface and package a large number of electronic ports and finally, the capability to interface a large number of optical ports.

Regarding the accumulated loss, even considering an unlimited quantity of programmable unit cells, the maximum size of the circuit will be limited by the optical power loss due to propagation through the waveguides and components inside the processor's core.

With respect to electrical interfacing the electrical routing of control signals imposes a system overhead that consumes a valuable portion of the design footprint. In some cases, the distribution of routing tracks demands an expanded redistribution of the optical components over the circuit to ensure the match between the on-chip electrical layer and the optical layer. This creates footprint issues and limits the final integration density.

Inefficient programming can be found in large-scale single-core programmable photonic processors when the use of peripheral high-performance building blocks is required. This issue arises when the location of the high-performance building blocks is not optimal for the required functionality and the signal is forced to travel relatively long distances through the core. This introduces additional losses to the circuit and increases the need for resources in the processor, which are employed just for internal interconnection purposes.

In order to mitigate the aforementioned limitations, a solution is required to scale the number of programmable unit cells in the circuit.

Multicore processors are well-known in the realms of electronics where these architectures revolve around the utilization of two or more computation units or cores placed in one single processor. The architecture rests on a "divide and conquer" strategy within a given clock cycle whereby when physical limitation presented scale up challenges, a "scale-out" approach was adopted [Add ref., 10.1.1.687.5977, (Venu, 2011)].

In Photonic Integrated Circuits (PICs) a few multicore architectures have been proposed, mainly to implement interconnection networks on chip, which are in turn applied to datacenters and transceivers. They employ different types of cores: photonic cross-point matrix switches, photonic broadcast and select and Wavelength Division Multiplexing (WDM) circuit routers, and electronic processors.

1. Cross-Point Switches [(A. Shacham, 2007), (Luca Ramini, 2012)]:

This approach relies on the connection of cores implementing cross-point switching matrices. Each "basic unit" of this approach is usually composed of ring resonators disposed in a matrix layout, with the basic unit present at each node. Some implementations also include the use of a multi-channel waveguide buses that integrate wavelength division multiplexing operation.

2. Broadcast and Select, WDM Circuit Routing [(T. Alexoudi, 2019), (Martijn Heck, 2014)]:

This approach relies on using MUX-DEMUX devices like arrayed-waveguide gratings and/or trees of directional couplers or MMIs along with selective units, which can be in the form of semiconductor optical amplifiers or ring resonators.

3. Photonic Assisted Electronic Multicore Processors.

This approach relies on electronic processors interconnected by photonic links. To do so, the architecture requires photonic components to transition from the electronic domain to the optical domain (modulators) and photodetectors to translate the signal from the optical domain to the electronic domain found in each core. The interconnection between electronic cores is done by means of a photonic network through different techniques.

These approaches have a few attributes in common, viz.:
a. Photonic cores:
  1. Are based on fixed application specific blocks (switching matrices, and/or demultiplexers) usually applied to network routing or optical interconnects (i.e. not carrying any optical signal processing tasks).

2. Rely on switches rather than tuneable couplers i.e. both cores operate over on/off digital states of 1 or 0 with the switch being on or off, while intermediate states as in a coupler are not used.
3. Are fixed and rigid in their layouts. While both can be used to route the channel selectively to various outputs, they cannot be used to perform any other function or replicate any other circuitry as per demand.

b. Electronic cores:
 1. Photonics is only employed to assist for the interconnection between electronic cores.
 2. Electro-optic and opto-electronic photonic components are required at each interface with the electronic core.

DESCRIPTION OF THE INVENTION

The object of the invention described here solves the scalability and performance problems described above for programmable photonic integrated circuits and allows the design and implementation of scalable programmable photonic integrated circuits by means of a multi-core architecture where two or more programmable photonic cores and/or additional high performance blocks are interconnected, thus providing a clear technical advantage to current approaches in term of ease of fabrication of large-scale circuits, performance, electrical/optical interfacing and scalability. In addition, the multicore modular approach enables fast and efficient setting of parallel and multitask computations and/or processing operations and the exploitation of their inherent advantages.

The object of the invention is based on the interconnection of cores of multipurpose programmable photonic processors. Each core includes a reconfigurable optical waveguide mesh arrangement of photonic gates that perform basic optical analog operations (reconfigurable optical power and energy division as well as independent phase shifting). In addition, each core can include a set of high-performance photonic blocks specifically designed to perform complex photonic and electro-optic operations. The combination and interconnection of the previous components/resources defines a single module or core. Therefore, and in view of the foregoing, it can be observed that the present object of the invention allows one or various simultaneous photonic circuits and/or linear multiport transformations by means of suitably programming of their resources, that is to say the corresponding programmable photonic circuits of each core, and the input and output ports.

The invention relates to a programmable multicore photonic integrated circuit comprising:
 at least two photonic blocks, wherein at least one of the at least two photonic blocks is a programmable photonic core comprising:
  i. a reconfigurable optical waveguide mesh arrangement of photonic gates configured to perform optical analog operations;
 wherein the at least one programmable photonic core is configured to be programmed and reconfigured to offer signal processing tasks either via non-recursive, recursive or combined recursive and non-recursive signal propagation.

Optionally, each of the at least one programmable photonic core further comprises a set of internal high-performance photonic blocks configured to perform photonic and electro-optic operations.

Optionally, each of the at least one programmable photonic core further comprises optical I/Os ports, wherein each of the at least one programmable photonic core is connected to at least one programmable photonic core via the optical I/Os ports.

Optionally, each of the at least one programmable photonic core further comprises a set of transition high-performance photonic blocks configured to perform photonic and electro-optic operations and additionally to be connected to the opticals I/Os ports.

Optionally, each of the at least one programmable photonic core is combined with a communication network configured to route the optical signals from each of the at least one programmable photonic core.

Optionally, each of the at least one programmable photonic core is connected to an adjacent programmable photonic core.

Optionally, each of the at least one programmable photonic core further comprises an auxiliary switching or routing layer.

Optionally, each of the at least one programmable photonic core is connected to a non-adjacent programmable photonic core.

Optionally, each of the at least one programmable photonic core is directly connected through at least one optical I/Os port to a distribution network.

Optionally, the distribution network connecting the at least one programmable photonic core is configured to distribute dedicated routing blocks on every programmable photonic core.

Optionally, the distribution network connecting the at least one programmable photonic core is configured to distribute dedicated routing blocks on a centralized subsystem.

Optionally, the at least one programmable photonic core is distributed over a two-dimensional layer.

Optionally, the at least one programmable photonic core is distributed over three-dimensional stacked layers, each layer comprising one programmable photonic core.

Optionally, the at least one programmable photonic core is distributed over three-dimensional stacked layers, each layer comprising at least one programmable photonic core.

Optionally, the programmable multicore photonic integrated circuit further comprises optical connectors or couplers configured to enable an interconnection between the at least one programmable photonic core of the layer/s.

Optionally, the programmable multicore photonic integrated circuit further comprises an integrated platform wherein the at least two photonic blocks are physically interconnected.

Optionally, the at least two photonic blocks are optically and electrically connected.

Optionally, the programmable multicore photonic integrated circuit further comprises at least one optical power monitor wherein the at least one programmable photonic core is connected.

Optionally, the programmable multicore photonic integrated circuit further comprises application-oriented blocks such as sensors, detectors, antennas, measurement, transmission blocks, electronics ICs selected from DACs or ADCs, drivers, monitors and/or amplifiers wherein the at least one programmable photonic core is connected.

Optionally, the programmable multicore photonic integrated circuit further comprises an electrical subsystem driving actuators or to on-chip actuators/receivers, to an electrical subsystem monitoring the optoelectronic read-outs and to an electronic processor or microprocessor that run the optimization and configuration programs.

Optionally, the programmable multicore photonic integrated circuit further comprises a control plane and/or software layer distributed over different subsystems which is configured to control the at least one programmable photonic core.

Optionally, the programmable multicore photonic integrated circuit further comprises a control plane and/or software layer aggregated on a single system which is configured to control the at least one programmable photonic core.

Optionally, each one of the at least one programmable photonic core is connected to multiple adjacent programmable photonic core.

Optionally, the communication network is a dedicated communication network configured to route the optical signals from each one of the at least one programmable photonic core.

Optionally, the communication network is a dedicated communication network configured to allow the interconnection of programmable photonic core with other non-adjacent programmable photonic core through the auxiliary switching or routing layer.

Optionally, the programmable multicore photonic integrated circuit is implemented and integrated on a chip.

Optionally, the chip follows a homogeneous PIC integration where the at least one programmable photonic core is integrated on a same substrate.

Optionally, the chip follows a heterogeneous PIC integration where the at least one programmable photonic core is integrated on a same substrate.

Optionally, the chip follows an on board integration (chiplet-like) approach where a common substrate or a common platform is used to apply a plug-and-play connection for laying out the at least one programmable photonic core based on a desired performance of a processor.

The invention also relates to a method of operating the programmable multicore photonic integrated circuit described above, wherein the method comprises connecting and utilising the at least one programmable photonic core so that a signal from one programmable photonic core, enters to at least other programmable photonic core, in a particular sequence where the programmable photonic integrated circuit progress in series.

Optionally, the method comprises connecting and utilising the at least one programmable photonic core so that a signal from one programmable photonic core, enters to at least other programmable photonic core, in a particular sequence where the programmable photonic integrated circuit splits and process the signals over the at least one programmable photonic core before its combination on a different programmable photonic core.

Optionally, the method comprises programming the at least one programmable photonic core to perform independent tasks at the same time, running in parallel.

The proposed photonic architecture based on the programmable multicore photonic integrated circuit of the invention drastically increments the series of advantages inherent to field programmable photonic hardware approaches, expanded by the circuit topologies introduced by the invention. These include:

Scalability of multipurpose programmable photonic circuits.
Shorter times for production and to market.
Lower prototype development and non-recurring engineering costs.
Reduced financial risk in developing ideas and translating them into ASPICs.
Multifunctional and multitask operation.
Circuit optimization.
Regular layouts and reduced footprints.
Better yield and reproducibility of the Programmable Photonic Analogue Blocks.
Larger number of alternative circuit topologies not constrained by geometrical factors.
Programming of more complex and versatile circuits.
Larger number of ports i.e. inputs and outputs
Enhanced functionality
Improved optical and electrical interfacing.
Better performance when programming larger and complex circuits.
Reduction and mitigation of optical crosstalk and tuning crosstalk.
Future scalability with minor design and verification cost.

The proposed based on the programmable multicore photonic integrated circuit of the invention is suitable for the following applications:

Aerospace and Defence (Avionics, Communications, Secure Solutions, Space)
Automotive (High Resolution Video, Image Processing Vehicle Networking and Connectivity, Automotive Infotainment)
Data Centers (Servers, Routers, Switches, Gateways)
High Performance Computing (Servers, Super Computers, SIGINT Systems, RADARs, Beam Forming Systems, Quantum computing, Neural networks)
Integrated Circuit Design (ASPIC Prototyping, Hardware Emulation)
Wired and Wireless Communications (Optical Transport Networks, Network Processing 5G Connectivity Interfaces, Mobile Backhaul)
Hardware accelerators.
Machine and Deep learning applications.
Artificial Intelligence
Smart transceivers.
Quantum photonic processors Thus, the technical innovation proposed in this invention proposes the architectures along with the workflows and control protocols of multicore programmable photonic integrated processors that enable large-scale integration of programmable processing cells and can exploit the parallelization of multiple-tasks. It brings at the same time a considerable performance improvement when compared to current architectures. It achieves improvement in functionality with respect to several factors, including, but not limited to, scalability, performance and multi-tasking efficiency.

The photonic cores of the present invention are not mere programmable interconnection subsystems that can not be programmed and reconfigured to offer signal processing tasks either via non-recursive or recursive signal propagation. Thus, these cores leverage on the extra degree of freedom being application agnostic. The overall device here can be defined as a reconfigurable network of reconfigurable signal processing cores.

DESCRIPTION OF THE DRAWINGS

In order to complement the description being made and with the object of helping to better understand the characteristics of the invention, in accordance with a preferred practical embodiment thereof, said description is accompanied, as an integral part thereof, by a set of figures where, in an illustrative and non-limiting manner, the following has been represented:

FIG. 7 (right) shows a non-limitative example of a schematic diagram of the proposed photonic architecture of the invention.

PREFERRED EMBODIMENT OF THE INVENTION

Figure 1:
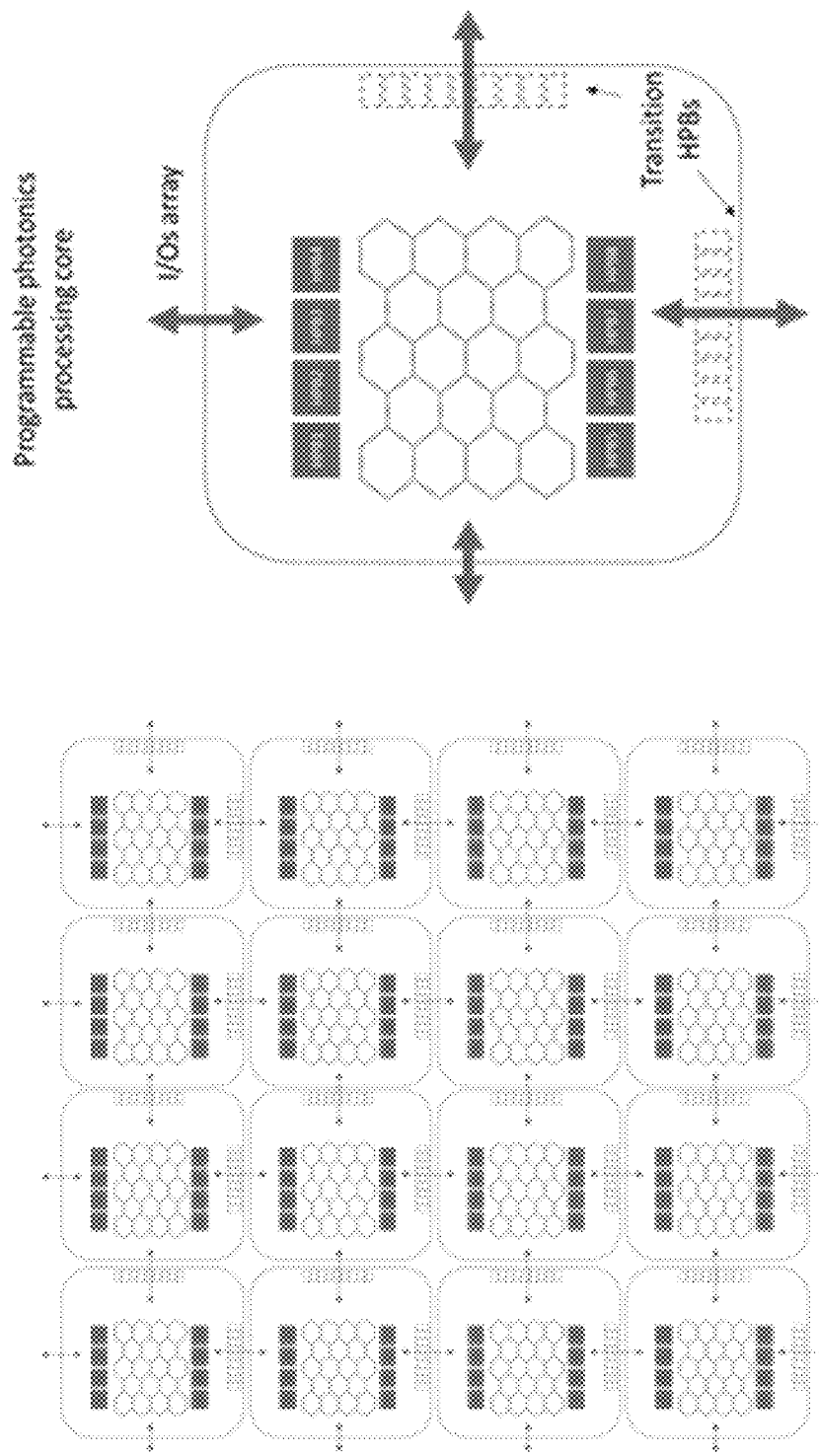
FIG. 1 shows a non-limitative example of a schematic diagram of the proposed photonic architecture of the invention, wherein the illustration shows an implementation example of a Multicore with seamless interconnect.
Figure 2:
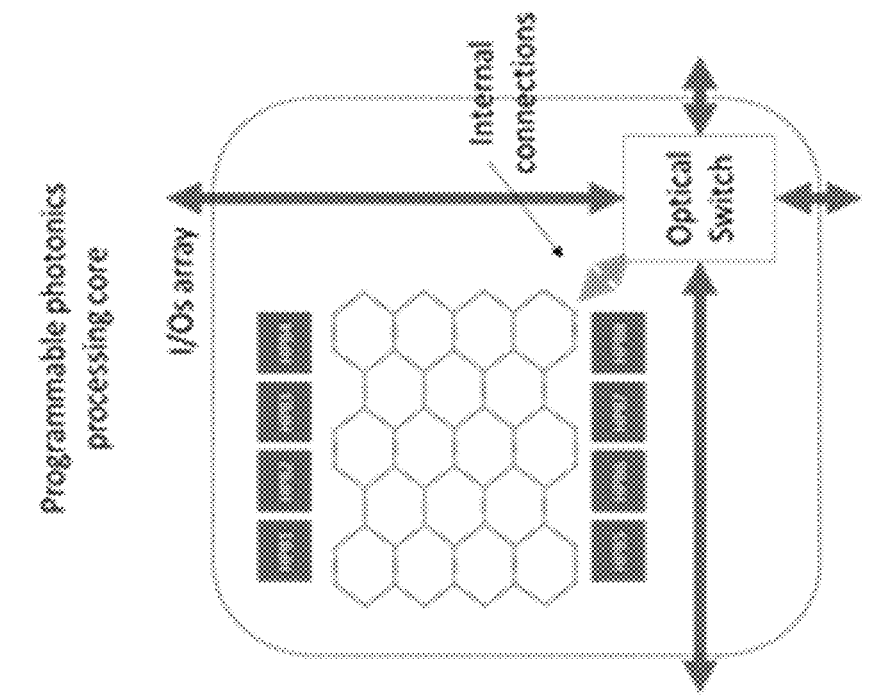
FIG. 2 shows a non-limitative example of a schematic diagram of the proposed photonic architecture of the invention.
Figure 2:
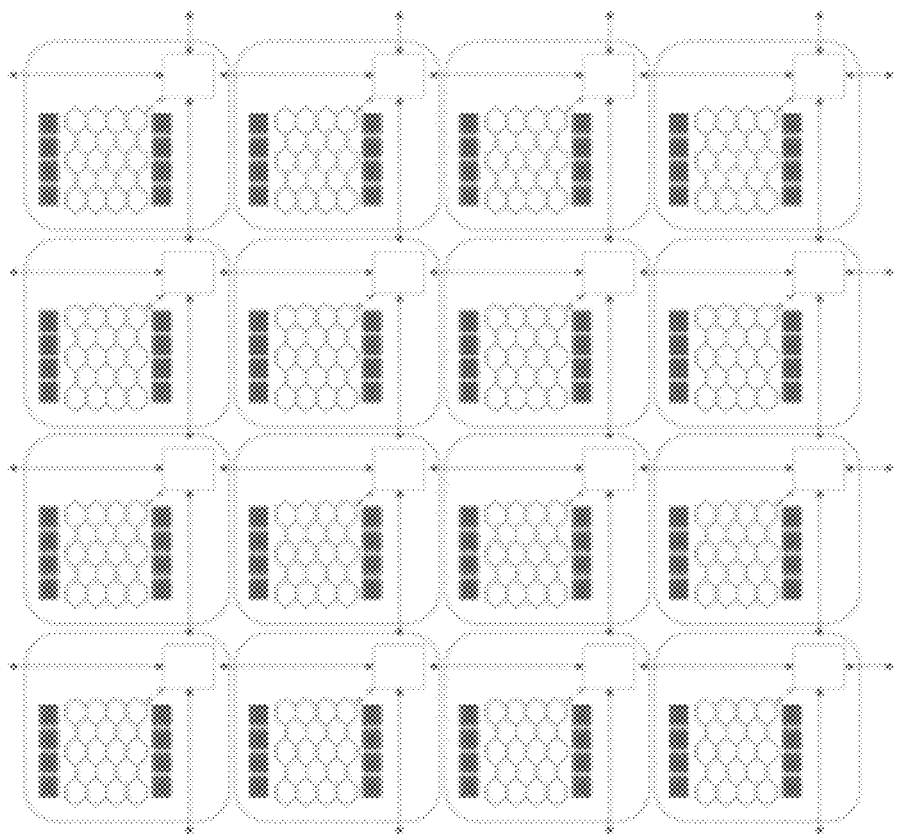
Figure 3:
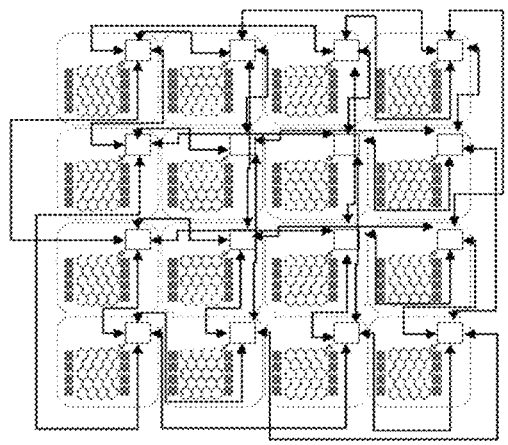
FIG. 3 shows non-limitative examples of schematic diagrams of the proposed photonic architecture of the invention.
Figure 3:
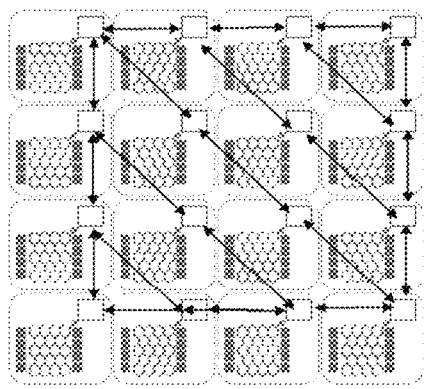
Figure 3:
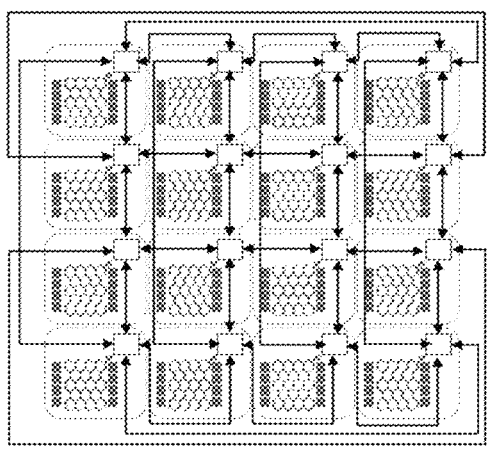
Figure 3:
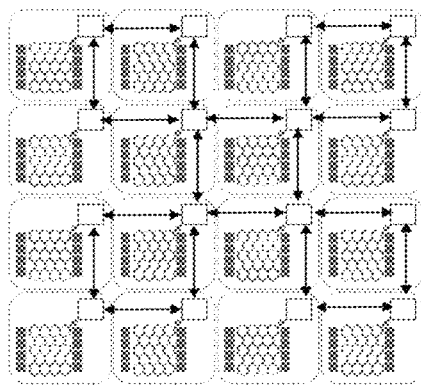

In a preferred embodiment of the object of the invention, a device is provided as shown in FIG. 1 where a set of at least two, but preferably a large number of multipurpose programmable photonic circuits are aggregated and connected in modules or cores, where each module or core of programmable photonic integrated circuit is used in conjunction with other programmable photonic circuits, or additional functional blocks which can be high performance blocks, specific functionality blocks or other such units. These blocks have programmable characteristics and perform optical signal processing on a photonic chip. Take into account that the design in FIG. 1 does not assume any particular interconnection geometry or topology for the multipurpose programmable photonic circuit present at each core or module and that the resulting design shown there is only for the purposes of illustration. Although various sub-core architectures may be considered, here we are illustrating the design with a very basic hexagonal waveguide mesh connected to a set of 8 high-performance building blocks and transition high-performance building blocks. FIG. 1-3 shows examples of the possible interconnection and architecture options but they are not limited to only these examples. In particular, the scheme of said multipurpose multicore programmable photonic processor is shown in FIG. 1 for a particular Multicore with seamless interconnect architecture. In this architecture, each processing core is connected with up to 4 neighbouring cores through its optical I/Os ports. The replication and interconnection of this module with its neighbouring cores leads to a straightforward processing network being characterized by its simplicity, scalability, design costs and versatility. Some designs variations can incorporate high-performance building blocks placed in the optical interface to perform specific functions including but not limited to optical signal amplification and nonlinear operations.

In some cases, it is beneficial to access the cores without the need to accessing directly to its internal resources or to have a hardware which can support both as required through a software control. FIG. 2 shows a non-limitative example of a schematic diagram of the proposed photonic architecture of the invention, wherein the illustration shows an implementation example of an implementation of Multicore with distributed interconnect. In this architecture, each processing core is combined with a communication network that routes the optical signals from each modular core. The replication and interconnection of this module with its neighbouring cores leads to an on-chip communication and processing network characterized by its efficiency, scalability, design costs and versatility. This architecture works similarly to the Field-Programmable Photonic Gate array architecture, where large quantities of general processing resources are accessible to the user. As in the previous approach, the design has no centralized resource that can get larger and more complicated as the number of cores increase. Thus, design complexity and verification complexity are independent of core count.

The previous two approaches do not allow the direct interconnection of cores that are not adjacent one to another. FIG. 3 shows a non-limitative example of a schematic diagram of the proposed photonic architecture of the invention, wherein the illustration shows an implementation example of a Multicore with centralized interconnect. This scheme allows the interconnection of a given core with other non-neighbouring cores employing an auxiliary switching/routing layer. This design is interesting in multicores with a reduced number of cores, but it comes at the cost of scalability issues and require additional verification and customization for each hardware upgrade.

By means of suitably programming each core or module, the multipurpose multicore programmable photonic processor can implement complex autonomous and/or parallel photonic circuits and signal processing transformations by discretizing complex optical processing circuits into different interconnected modules of programmable photonic processors. The goal then is to achieve a functional advantage given by the modular approach and increase the performance, scalability, versatility and adding novel higher processing capabilities.

Figure 4:
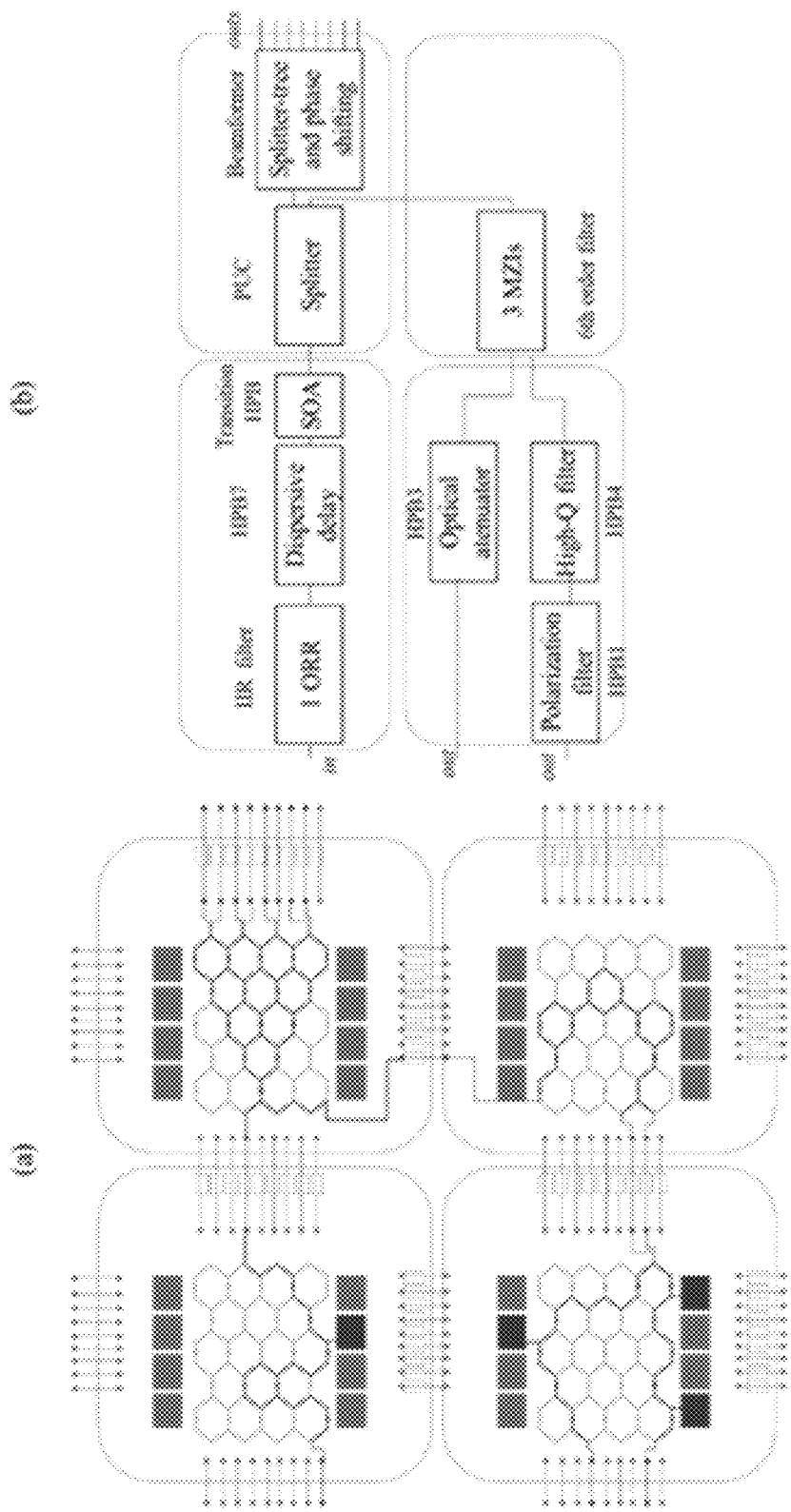
FIG. 4 shows a non-limitative example of a schematic diagram of the proposed photonic architecture of the invention.
Figure 5:
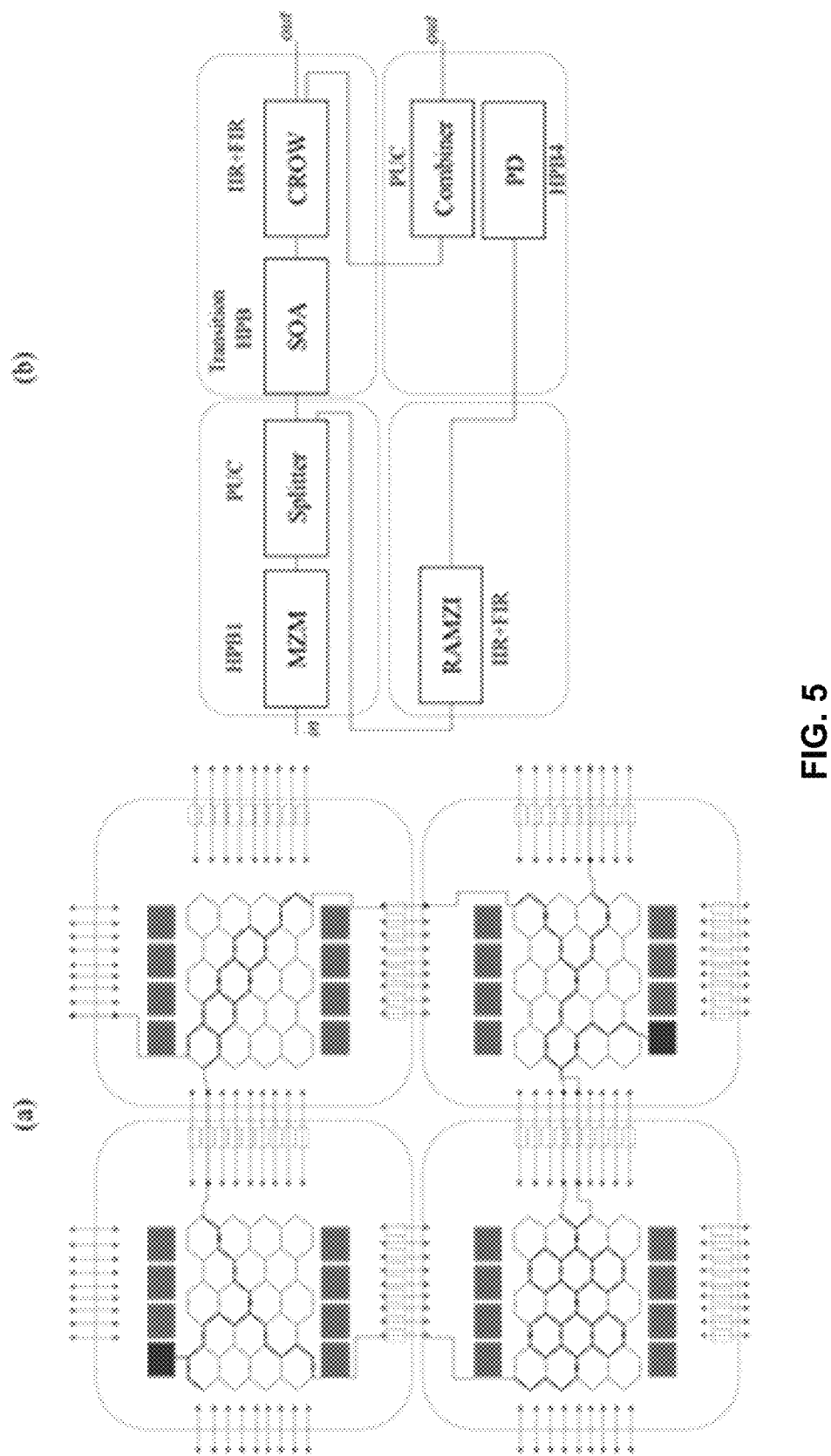
FIG. 5 shows a non-limitative example of a schematic diagram of the proposed photonic architecture of the invention.
Figure 6:
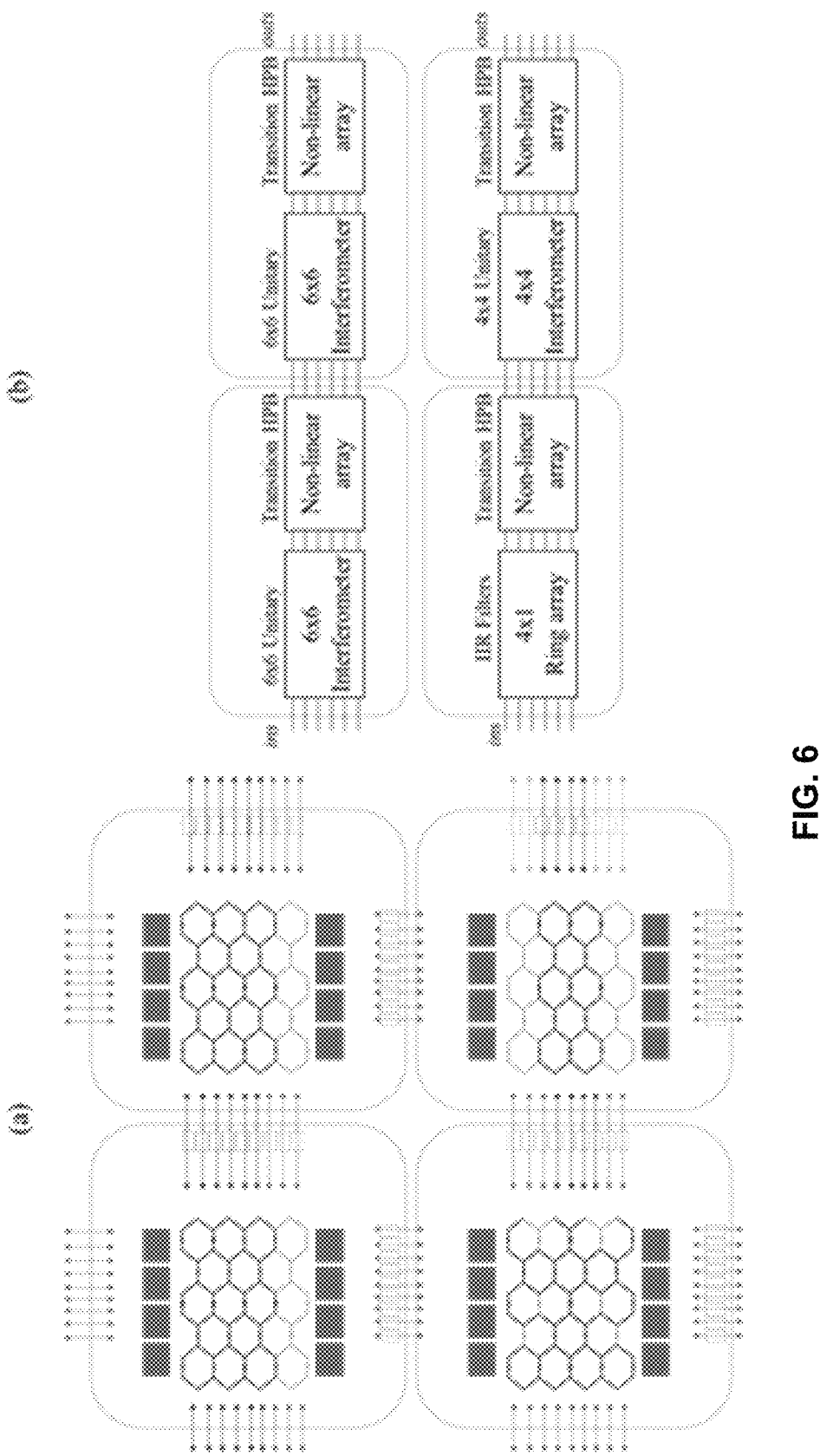
FIG. 6 shows a non-limitative example of a schematic diagram of the proposed photonic architecture of the invention.

In particular, the invention is illustrated in FIGS. 4-6, where it is shown how complex optical signal processing circuits can be configured by means of the programming of the proposed device. In particular, we show how the Multicore with seamless interconnect architecture programs a complex circuit distributed in 4 cores, the capabilities of adding sections of the circuit working in parallel, and the capability to perform independent multitask operations.

The multipurpose multicore programmable photonic processor combines the programmability of the basic programmable photonic processors in a scalable interconnection structure, allowing programmable circuits with scalable processing capabilities and with added functionalities like enhanced circuit parallelization. Thus, processing complexity comes from the interconnectivity internal to the core and between cores. In addition, it solves the major problems related to the scalability of programmable photonic circuits, where increasing the density of its programmable unit cells comes at the cost of adversarial effects like optical crosstalk, tuning crosstalk, non-scalable optical and electrical interfacing and limited footprint for fabrication processes. Multicore programmable photonic processor architectures include the interconnection of several general-purpose cores and arise as an elegant solution to scale the performance of conventional photonic processors. Since the scalability limits of single-core processors is exacerbated when a larger number of programmable unit cells are integrated in the circuit, a straightforward approach is to use an architecture that integrates and interconnects several smaller cores.

The control of this whole device including all the interconnected blocks can either be carried out using the individual software for driving each core or can be added into one software interface leading to a common mean to drive, program, control and re-configure the whole hardware. A common software enables the smart programming and management of resources to achieve optimal configurations in terms of number of components employed, power consumption, programming efficiency, mitigation of side effects (optical and tuning crosstalk).

OPERATION EXAMPLES

The disaggregated nature of multicore photonic processors enables a wide set of modes of operations. In this section we illustrate some non-limiting examples:

FIG. 4 shows a schematic of Programming of progressively distributed circuits (Serialization) wherein the illustration shows a configuration example of a Multicore with seamless interconnect where a complex circuit is programmed over 4 cores following a serial circuit. The circuit includes the programming of (first core) ring resonator, dispersive delay in a high-performance building block, optical amplifier in a transition HPB, (second core) an optical splitter, a beamforming network, (third core) a $6^{th}$ order Finite Impulse Response Filter, and (fourth core) a branch with an optical attenuator implemented by a high-performance building block and a branch with a high-q filter and a polarization filter. The configuration of complex photonic circuit on a single-core processor is limited by the number of optical ports, programmable unit cells and high-performance blocks available in the circuit. In addition, the accumulation of non-ideal effects (optical and crosstalk during phase tuning), and the large number of required programmable unit cells to perform complex operations might rapidly limit the circuits that the inner core can implement. FIG. 4 illustrates how the multicore architecture divides and distributes the circuit into the cores. The programmed circuit does not target any application and is merely set to highlight the main capabilities of this mode of operation. In this case, the first core (top left) configures an optical ring resonator in the inner core, accesses a dispersive delay provided by the HPB 7 and amplifies the optical signal before connecting to the next core. The next core (top right) splits the optical signal into two paths. The first path feeds a programmed optical beamformer, demonstrating the benefits of the multicore approach for circuits that require multiple optical paths and ports. The other path is directed to the interconnected output to access the third core. The third core (bottom right) implements an optical lattice filter in its core based on three unbalanced MZIs and directs the two outputs of the filter to the next and the last core. The last core (bottom left) distribute one of the optical interconnections to an optical attenuator and the other optical connection to a cascade of an HPB filter and a polarization filter, respectively.

FIG. 5 shows a schematic of Programming of parallelly-distributed circuits (Parallelization) wherein the illustration shows a configuration example of a Multicore with seamless interconnect where a complex circuit is programmed over 4 cores following a parallel circuit. The circuit includes the programming of (top left core) Mach-Zehnder Modulator, and optical splitter and an optical amplifier, (top right core) an optical filter with two outputs, (bottom left core) an optical filter based on an MZI and four ring resonators, and (bottom right core) a combiner, and a photodetector. Some circuits include circuit divisions into blocks that run in parallel. Although possible in single-core processors, the programming of these circuits can be limited when programmed in single cores individually. In this case, the interference between the branches of the circuit that run in parallel can reduce the overall processing performance. In order to mitigate this effect, multicore-architectures can distribute sections of the same circuit that run in parallel over different processing cores. FIG. 5 illustrates the programming of a circuit distributed over 4 cores. The first core (top left) gets the input signal and access to a MZI modulator before splitting and routing it to the second (top right) and third (bottom left) core. Each core contains a different optical filter. In the first case it is a third-order ring resonator architecture that extracts the passband and feeds it onto the fourth core (bottom right) and the stopband or reflection response to an external port. The second case (bottom left) is an optical filter that combines lattice filters and optical ring resonators before directing the two output ports to the fourth core. The last core (bottom right) receives the signal from two different cores. The signal coming from the bottom-left core is detected using a high-speed photodiode block. The second signal coming from the bottom left core is combined with the optical signal coming from the top-right core before accessing to the optical output port.

FIG. 6 shows a schematic of Programming independent circuits (Multitask) wherein the illustration shows a configuration example of a Multicore with seamless interconnect where two independent complex circuit are programmed over 4 cores following multitasking operation. The circuit includes a cascade of two unitary blocks with an intermediate nonlinear section (top cores) and another cascade of a filtering section of 4 rings in an array followed by a 4×4 multiport interferometer. The last key advantage of multicore photonic processors resides in their capability to perform independent tasks at the same time. This capability can be exploited on single-core processors as well, but additional optimization techniques need to be applied to mitigate the crosstalk between both circuits. In short, the processor programs two or more circuits running in parallel and performing independent tasks. The circuits can be of the same or a totally different design. In addition, the circuits can be distributed over different cores or can be programmed to share some of the resources available on the same core for the cases including but not limited to exigent applications. FIG. 6 illustrates an example where the multicore architecture programs two independent circuits. The upper cores configure a two-layer neural network of 6 modes. The cores located at the bottom of the processor configure an initial filtering stage before accessing to a 4×4 interferometer followed by a non-linear array.

Physical Implementation

The physical implementation of the MULTIPURPOSE MULTICORE PROGRAMMABLE PHOTONIC PROCESSOR calls for an integrated optics approach either based on silicon photonics platform and/or a hybrid/heterogeneous III-V, and/or group IIV-Vs and/or barium-titanate and/or any other chalcogenide and/or II-VI platform. It is not only limited to the integration of programmable photonics ICs with other photonics ICs and/or blocks but also with electronics ICs and subsequent blocks of such nature.

As for the programmable photonic blocks, the currently available photonics technology options are based on any phase or amplitude tuning effect like: MEMS, thermo-optic effects, electro-optic effects, opto-mechanics, electro-capacitive effects or non-volatile phase actuators. This phase shifters and actuators are integrated in any interferometric structure with two or more ports.

Different architecture and integration levels are included in the physical implementation which can be classified as follows:

Architectures:

Heterogeneous architectures: Although one of the key advantages of multicore architectures is the replication of the same unit core, the range of applications can be expanded if each core employs different HPBs as well as inner core topologies. As an illustrative example FIG. 7 (left) shows a configuration example of a Multicore with seamless interconnect with a heterogeneous architecture where 4 cores have a different internal composition. In particular, each core includes a set of high-performance processing blocks and a different waveguide mesh arrangement (hexagonal, triangular, square and feedforward). That is to say, it is a 4-core architecture with different inner cores for each module: hexagonal mesh architecture, triangular mesh architecture, square mesh architecture and a rectangular multiport interferometer. Note as well, that each one can integrate different HPBs. The key advantage of this implementation resides on the availability of specific resources required by some applications. For example, the feedforward mesh illustrated in the bottom right core can be implemented by the hexagonal mesh, but in a less efficient way.

2D architectures: 2D architectures can be implemented considering the current standards and state of PIC and their integration. The 2d architectures would most commonly come across as connecting a chip to another in the photonic equivalent of making a "short" through connecting optical fibres or waveguides coming off from the different chips. This can be done with a singular package of different photonics chips on the same or different integration platforms.

Figure 7:
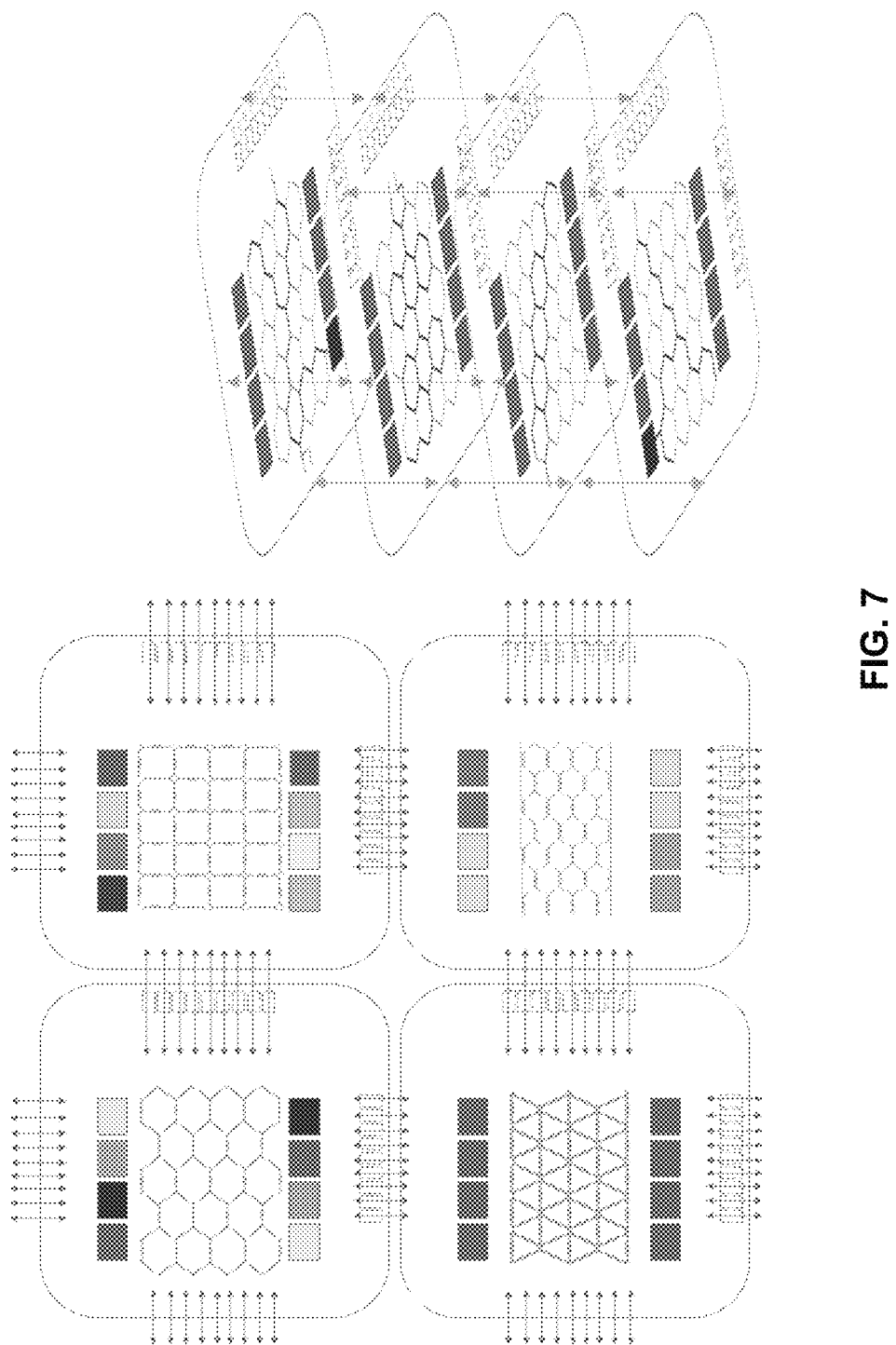
FIG. 7 (left) shows a non-limitative example of a schematic diagram of the proposed photonic architecture of the invention.

3D architectures (single and multi-core): FIG. 7 (right) shows a 3D architecture with 4 cores, each one connected to their neighbours through vertical interconnections. That is to say, it is a multicore with seamless interconnect programming 4 cascaded circuits on a 3D integration shape. The connections between cores are done by waveguide couplers designed to couple the light in the vertical direction to an upper/lower waveguide layer.

3D stacking architectures rely on placing multiple cores in a 3D layout (as shown in FIG. 7 for performance enhancements in relation to the processing power. Single core designs are limited in its scalability by the reticle size of the fabrication tools. Such core, post-assembly can be individually stacked together to form multiple cores to overcome such limits but then the form factor is compromised. A solution in which can drastically reduce the form factor while showing a manifold increase in the performance is 3D stacking whereby such cores are placed in layer stacks one on top of each other with interconnections running through each to form a larger and more functionally potent unit. The stacking can be set in parallel to aid parallel processing leading to the possibility of performing functionalities in parallel.

A mixed architecture of 2D and 3D multicores can also be implemented.

Integration Level:

On chip integration: On-chip integration implies that the photonic core is connected to neighbouring cores or additional functional blocks with all the core and elements being in the same substrate. The on-chip integration can be carried out in a multitude of approaches with the most common one's listed below:

Homogeneous PIC Integration: In this approach, all the cores are realized on the same fabrication run on a single die of the PIC. Multiple cores can be implemented in such an approach and the key advantage of homogenous integration comes from the very small form factor that can be achieved. Single core implementation in programmable PICs are limited by the sheer geometric constraints presented by the size of the reticle. In this approach as presented in the present invention, a non-limiting example is a multicore processor formed by fabricating the same core across a single wafer and with one or more cores core being defined as the unit fabricated in one reticle. All or some of the different segments of the wafer with the core(s) defined in a reticle are then left interconnected i.e. the different dies are not cleaved but left as a conglomerate interconnection of multiple dies with cores to give rise to a multicore processor where all the cores are defined and set purely during fabrication thus negating the need for interconnection of the different cores during packaging. This approach then relaxes the demands on PIC packaging and increases the throughput and facilitates the hardware realisation through a more simplistic process flow.

Heterogeneous PIC Integration: Heterogenous PICs revolve around the integration of two or more different materials on the same chip substrate. The most common executions of such approach can be seen with active devices in InP integrated with small form factor SOI circuits or low loss SiN platform but can even extend to other materials such a Barium Titanate (BTO), graphene, chalcogenides, etc. As a photonic gain medium does not exist in pure SOI or SiN circuit, this adds a great deal of functionality, including but not limited to, integration of on-chip laser as well as gain elements which can then in turn aid in achieving several multi-core architectures. The implementation in itself is reliant on a thin layer of InP or other III-V material being "attached" in specific sections, on top of a SOI or SiN chip. The light, at these sections is evanescently coupled from the SOI or SiN waveguides into the InP sections to induce gain or as an efficient phase modulation sections. The process of "attaching" is then carried out through means like BCB or other polymers by wafer bonding techniques or can involve other means such as micro-transfer printing.

On board integration (chiplet-like): The basis of this implementation is to divide chip design (co-design) and fabrication based on their basic functionality, so for example, that can come in the form of functional sub-system blocks like the core, active blocks like lasers and gain medium, non-linear blocks, etc. After these said blocks have been manufactured and the sub-assembly (individual chip packaging) has been done, they will be placed on a platform which is an interlinked substrate and then packaged into a single unit. Chiplets address the fact that there's no one-size-fits-all approach that works to meet current demands. This implementation is not only limited to the aggregation of photonic multipurpose photonic blocks and/or other high-performance photonics blocks but can also include pure electronic blocks including but not limited to drivers, monitors, ADCs, DACs, amplifiers, sensors and antennas.

Figure 8:
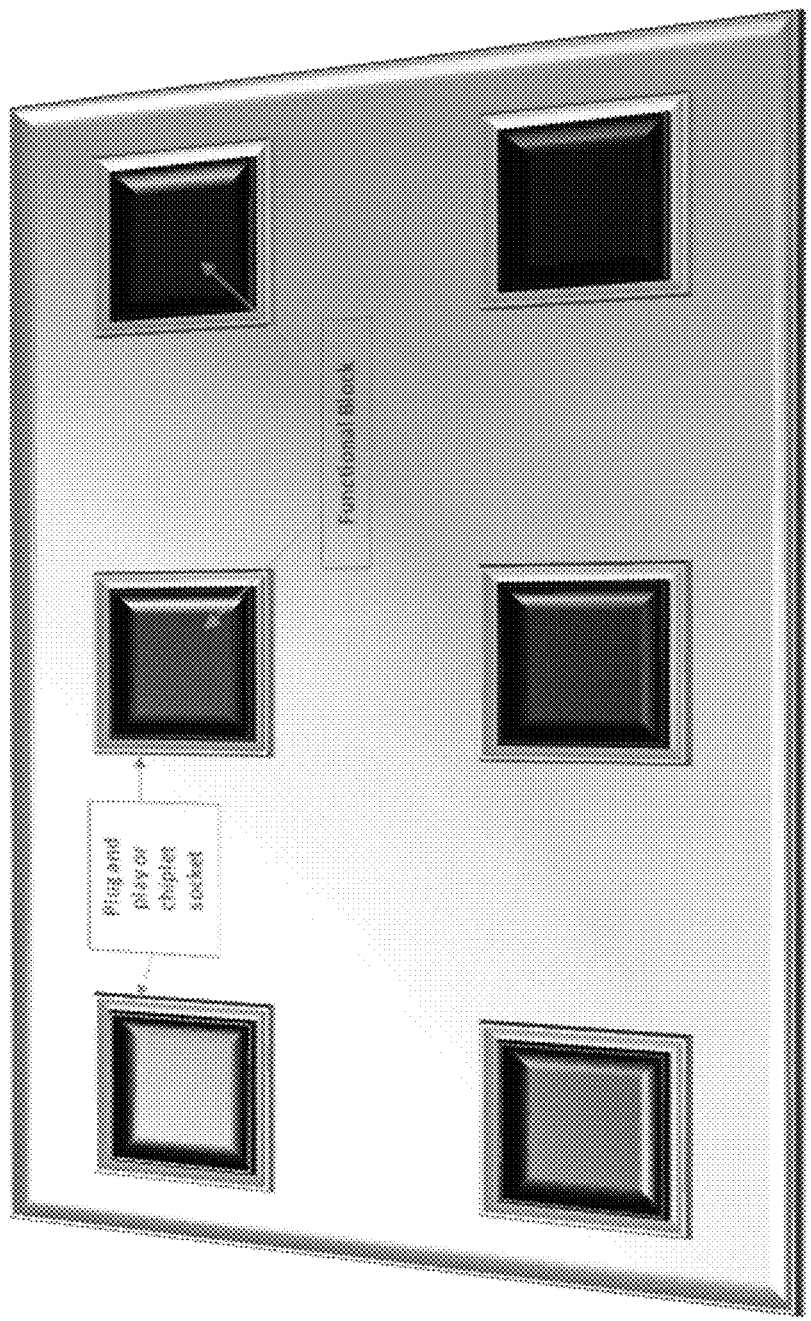
FIG. 8 shows a non-limitative example of a schematic diagram of the proposed photonic architecture of the invention.

FIG. 8 shows a non-limitative example of a schematic diagram of the proposed photonic architecture of the invention, wherein the illustration shows an implementation example of a implementation of said MULTIPURPOSE PROGRAMMABLE PHOTONIC PROCESSOR in a multicore layout were each core can be connected in a plug-and-play or chiplet-like approach whereby a common platform shown in green is used to interconnect two or more programmable photonic blocks with other programmable photonic blocks or functional units. All these units are represented in the schematic as black boxes as they can include two or more programmable PICs and/or photonic high performance building blocks which can be further extend to include pure electronic ICs such as drivers, monitors, ADCs, DACs, sensors, antennas, etc.

In addition, all the previous implementations can employ a control and driving subsystem to enable the control and driving of the multipurpose multicore programmable photonic processor. The control and driving circuitry enable the extraction and reading of optical signals and the driving of the photonic actuators.

The invention claimed is:

1. A programmable multicore photonic integrated circuit comprising:
   at least two photonic blocks, wherein at least one of the at least two photonic blocks is a programmable photonic core comprising:
   i. a reconfigurable optical waveguide mesh arrangement of photonic gates configured to perform optical analog operations;
   wherein the at least one of the at least two photonic blocks that is a programmable photonic core is configured to be programmed and reconfigured to offer signal processing tasks either via non-recursive, recursive or combined recursive and non-recursive signal propagation; and
   wherein each of the at least one programmable photonic core further comprises an auxiliary switching or routing layer.

2. The programmable multicore photonic integrated circuit according to claim 1 wherein each of the at least one programmable photonic core further comprises a set of internal high-performance photonic blocks configured to perform photonic and electro-optic operations.

3. The programmable multicore photonic integrated circuit according to claim 1 wherein each of the at least one of the at least two photonic blocks that is a programmable photonic core further comprises optical I/Os ports, wherein each of the at least one programmable photonic core is connected to at least one programmable photonic core via the optical I/Os ports.

4. The programmable multicore photonic integrated circuit according to claim 3 wherein each of the at least one of the at least two photonic blocks that is a programmable photonic core further comprises a set of transition high-performance photonic blocks configured to perform photonic and electro-optic operations and additionally to be connected to the optical I/Os ports.

5. The programmable multicore photonic integrated circuit according to claim 4 wherein each of the at least one of the at least two photonic blocks that is a programmable photonic core is connected to an adjacent programmable photonic core.

6. The programmable multicore photonic integrated circuit according to claim 1 wherein each of the at least one programmable photonic core is combined with a communication network configured to route the optical signals from each of the at least one programmable photonic core.

7. The programmable multicore photonic integrated circuit according to claim 1, further comprising an integrated platform wherein the at least two photonic blocks are physically interconnected.

8. The programmable multicore photonic integrated circuit according to claim 1 wherein each of the at least one programmable photonic core is connected to a non-adjacent programmable photonic core.

9. The programmable multicore photonic integrated circuit according to claim 3 wherein each of the at least one of the at least two photonic blocks that is a programmable photonic core is directly connected through at least one optical I/Os port to a distribution network.

10. The programmable multicore photonic integrated circuit according to claim 9 wherein the distribution network connecting the at least one programmable photonic core is configured to distribute dedicated routing blocks on every programmable photonic core.

11. The programmable multicore photonic integrated circuit according to claim 1, wherein the at least two photonic blocks are optically and electrically connected.

12. A programmable multicore photonic integrated circuit comprising:
    at least two photonic blocks, wherein at least one of the at least two photonic blocks is a programmable photonic core comprising:
    i. a reconfigurable optical waveguide mesh arrangement of photonic gates configured to perform optical analog operations;
    wherein the at least one of the at least two photonic blocks that is a programmable photonic core is configured to be programmed and reconfigured to offer signal processing tasks either via non-recursive, recursive or combined recursive and non-recursive signal propagation;
    wherein each of the at least one programmable photonic core further comprises optical I/Os ports, wherein each of the at least one programmable photonic core is connected to at least one programmable photonic core via the optical I/Os ports;
    wherein each of the at least one programmable photonic core is directly connected through at least one optical I/Os port to a distribution network; and
    wherein the distribution network connecting the at least one of the at least two photonic blocks that is a programmable photonic core is configured to distribute dedicated routing blocks on a centralized subsystem.

13. The programmable multicore photonic integrated circuit according to claim 1 wherein the at least one programmable photonic core is distributed over three-dimensional stacked layers, each layer comprising one programmable photonic core.

14. The programmable multicore photonic integrated circuit according to claim 13, further comprising optical connectors or couplers configured to enable an interconnection between the at least one programmable photonic core of the three-dimensional stacked layers.

15. The programmable multicore photonic integrated circuit according to claim 1 wherein the at least one programmable photonic core is distributed over a two-dimensional layer.

16. A programmable multicore photonic integrated circuit comprising:

at least two photonic blocks, wherein at least one of the at least two photonic blocks is a programmable photonic core comprising:
  i. a reconfigurable optical waveguide mesh arrangement of photonic gates configured to perform optical analog operations;
wherein the at least one of the at least two photonic blocks that is a programmable photonic core is configured to be programmed and reconfigured to offer signal processing tasks either via non-recursive, recursive or combined recursive and non-recursive signal propagation; and
wherein the at least one programmable photonic core is distributed over three-dimensional stacked layers, each layer comprising at least one programmable photonic core.

17. A method of operating the programmable multicore photonic integrated circuit comprising:
  at least two photonic blocks, wherein at least one of the at least two photonic blocks is a programmable photonic core comprising:
    i. a reconfigurable optical waveguide mesh arrangement of photonic gates configured to perform optical analog operations;
  wherein the at least one of the at least two photonic blocks that is a programmable photonic core is configured to be programmed and reconfigured to offer signal processing tasks either via non-recursive, recursive or combined recursive and non-recursive signal propagation, and
  wherein the method comprises connecting and utilising the at least one programmable photonic core so that a signal from one programmable photonic core, enters to at least other programmable photonic core, in a particular sequence where the programmable photonic integrated circuit splits and process the signals over the at least one programmable photonic core before combining on a different programmable photonic core.

* * * * *